United States Patent [19]
Hatanaka et al.

[11] Patent Number: 5,834,822
[45] Date of Patent: Nov. 10, 1998

[54] IMAGE SENSOR

[75] Inventors: Katsunori Hatanaka, Yokohama; Toshihiro Saika; Takayuki Ishii, both of Hiratsuka; Katsuhiko Yamada, Atsugi, all of Japan

[73] Assignee: Canon Kabushiki Kaisha, Tokyo, Japan

[21] Appl. No.: 845,401

[22] Filed: Apr. 25, 1997

Related U.S. Application Data

[62] Division of Ser. No. 393,884, Feb. 22, 1995, Pat. No. 5,672,902, which is a continuation of Ser. No. 31,018, Mar. 11, 1993, abandoned, which is a continuation of Ser. No. 642,162, Jan. 17, 1991, abandoned, which is a continuation of Ser. No. 207,200, Jun. 16, 1988, abandoned.

[30]  Foreign Application Priority Data

Jun. 26, 1987 [JP] Japan .................................. 62-160506

[51] Int. Cl.$^6$ ............................. H01L 31/10; H01L 27/02
[52] U.S. Cl. ......................... 257/431; 257/491; 257/499; 257/691; 257/724
[58] Field of Search .................................. 257/431, 433, 257/491, 499, 691, 724, 355

[56]  References Cited

U.S. PATENT DOCUMENTS

| | | | |
|---|---|---|---|
| 3,590,340 | 6/1971 | Kubo et al. | 257/363 |
| 4,393,464 | 7/1983 | Knapp et al. | 257/45 |
| 4,438,449 | 3/1984 | Usuda | 257/356 |
| 4,763,010 | 8/1988 | Fukaya et al. | 357/2 |
| 4,803,536 | 2/1989 | Tuan | 357/45 |
| 4,819,047 | 4/1989 | Gilfeather et al. | 357/45 |
| 4,823,178 | 4/1989 | Suda | 357/23.7 |
| 4,862,237 | 8/1989 | Morozumi | 357/23.7 |
| 4,866,291 | 9/1989 | Shimada et al. | 257/431 |

Primary Examiner—Donald Monin
Attorney, Agent, or Firm—Fitzpatrick, Cella, Harper & Scinto

[57]  ABSTRACT

An image sensor includes a substrate on which a light-receiving element and a thin-film transistor for transferring an output from the light-receiving element are formed, and a silicon integrated circuit chip for driving the thin-film transistor and processing signals. All externally connected input/output signal lines are extracted through or electrical connections to the silicon integrated circuit chip.

7 Claims, 4 Drawing Sheets

5,834,822

IMAGE SENSOR

This application is a division of application Ser. No. 08/393,884 filed Feb. 22 1995, now U.S. Pat. No. 5,672,902 which is a continuation of application Ser. No. 08/031,018, filed Mar. 11, 1993, now abandoned, which is a continuation of application Ser. No. 07/642,162, filed Jan. 17, 1991, now abandoned, which is a continuation of application Ser. No. 07/207,200, filed Jun. 16, 1988, now abandoned.

BACKGROUND OF THE INVENTION

1. Field of the Invention

The present invention relates to an image sensor represented by a contact type line sensor used in a facsimile system, an image scanner, or the like and, more particularly, to an image sensor having a signal scanning circuit of thin-film transistors formed on a sensor substrate.

2. Related Background Art

The present applicant proposed an image sensor using thin-film transistors in a signal scanning circuit in Japaneses Patent Laid-Open (Kokai) Nos. 56-138967, 56-138968, 56-138362, and 56-138969, and Japanese Patent Application Nos. 61-184990 and 61-311205.

FIG. 1 shows an equivalent circuit diagram of a conventional image sensor obtained such that thin-film transistors (to be referred to as TFTs hereinafter), TFT sensor elements, storage capacitors, a matrix wiring, and the like are integrally formed on a glass substrate using hydrogenated amorphous silicon (to be referred to as a—Si:H hereinafter).

The image sensor includes photosensors $S_1$ to $S_{n \cdot m}$ each having a TFT structure, and storage capacitors $C_{S1}$ to $C_{Sn \cdot m}$ for storing photocurrents from the sensors $S_1$ to $S_{n \cdot m}$ TFTs $T_1$ to $T_{n \cdot m}$ transfer charges stored in the storage capacitors $C_{S1}$ to $C_{Sn \cdot m}$ to load capacitors $C_{L1}$ to $C_{Ln}$. TFTs $R_1$ to $R_{n \cdot m}$ reset the storage capacitors $C_{S1}$ to $C_{Sn \cdot m}$ to reset potentials $V_R$. Gate electrodes of the transfer and reset TFTs are grouped in units of blocks and are connected to outputs $G_1$ to $G_{m+1}$ of a gate driving IC 4. The TFT source electrodes of the respective blocks are commonly connected in units of source lines having identical positions and are connected to input terminals $S_{w1}$ to $S_{wn}$ of a signal switching IC 3. A sensor bias voltage $V_S$, a sensor gate bias voltage $V_B$, and a reset bias voltage $V_R$ have predetermined values, respectively.

FIG. 2 shows an arrangement of a conventional sensor unit. The sensor unit includes a casing 1, a sensor substrate 2, a signal switching IC 3, a gate driving IC 4, an extracting flexible printed circuit board 5, bias lines 6 for the bias voltages $V_R$, $V_S$, and $V_B$, and GND, and a connector 7 connected to a main unit. The unit also includes a sensor 9, storage capacitors 10, and TFTs 11. In this arrangement, optical components such as a lens, a light source, and the like are omitted.

The conventional image sensor described above, however, presents electrostatic problems.

An element such as a TFT, a TFT sensor, and a storage capacitor formed on a substrate has a structure including a thin insulating interlayer. Therefore, when a voltage having a level exceeding a predetermined level is applied, breakdown occurs in the insulating interlayer and the elements are damaged. This damage easily occurs by electrostatic components generated by the clothing of an operator or the like.

During sensor substrate fabrication, IC mounting, and sensor unit assembly, generation of static electricity is satisfactorily prevented so as to solve the above problems. However, after sensor units are shipped, they are handled in the same manner as general electronic components until they are built into main units of application equipment in a factory of a facsimile system, an image scanner, or the like. For this reason, defects due to electrostatic breakdown often occur.

A cause of defects was examined in a sensor unit shown in FIG. 1. It was confirmed that the TFTs, the sensors, and the like connected from the connector 7 to the bias lines 6 for bias voltages $V_R$, $V_S$, and $V_B$ were damaged.

According to a conventional method of preventing electrostatic breakdown, protective diodes are used in CMOS ICs. In other words, each diode is connected to a power input terminal and a GND input terminal so as to dissipate the static electricity.

When the above method is employed, two diodes are required for each bias line, and a chip must be mounted in a unit. As a result, the above method is not preferred in view of cost, mounting space, and the like.

SUMMARY OF THE INVENTION

It is an object of the present invention to provide an image sensor which can eliminate the above problems. In order to achieve this object, there is provided an image sensor including a substrate on which a light-receiving element and a thin-film transistor for transferring an output from the light-receiving element are formed, and a silicon integrated circuit chip for driving the thin-film transistor and processing signals, wherein all externally connected input/output signal lines are extracted through or electrical connections to the silicon integrated circuit chip.

According to the present invention, with the above arrangement, an electrostatic prevention circuit for sensor bias lines is arranged in a driving IC chip, thereby preventing electrostatic breakdown of a sensor unit. Therefore, a low-cost and compact image sensor free from electrostatic breakdown can be provided.

DETAILED DESCRIPTION OF THE PREFERRED EMBODIMENTS

Figure 1:
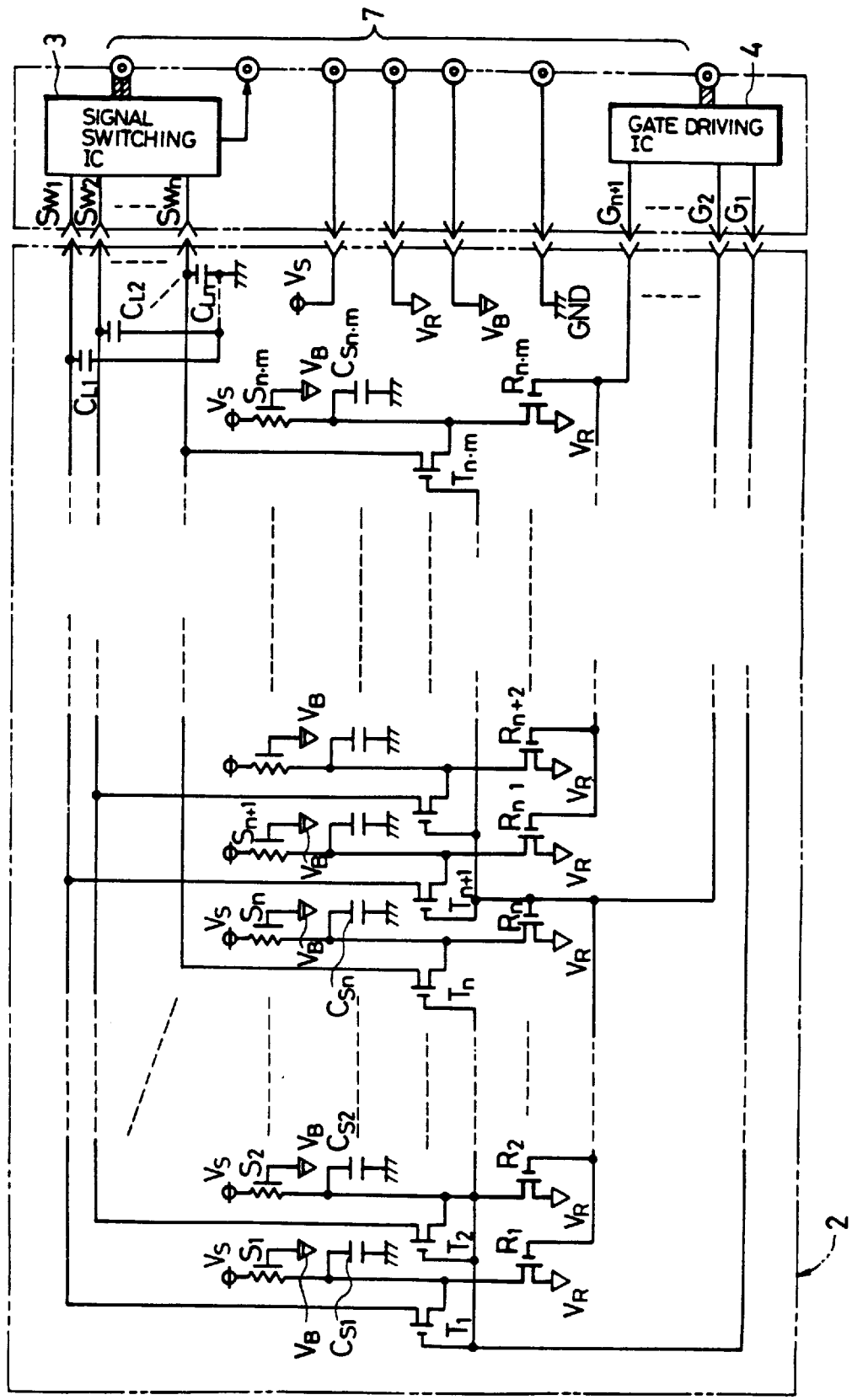
FIG. 1 is an equivalent circuit diagram of a conventional line sensor.
Figure 2:
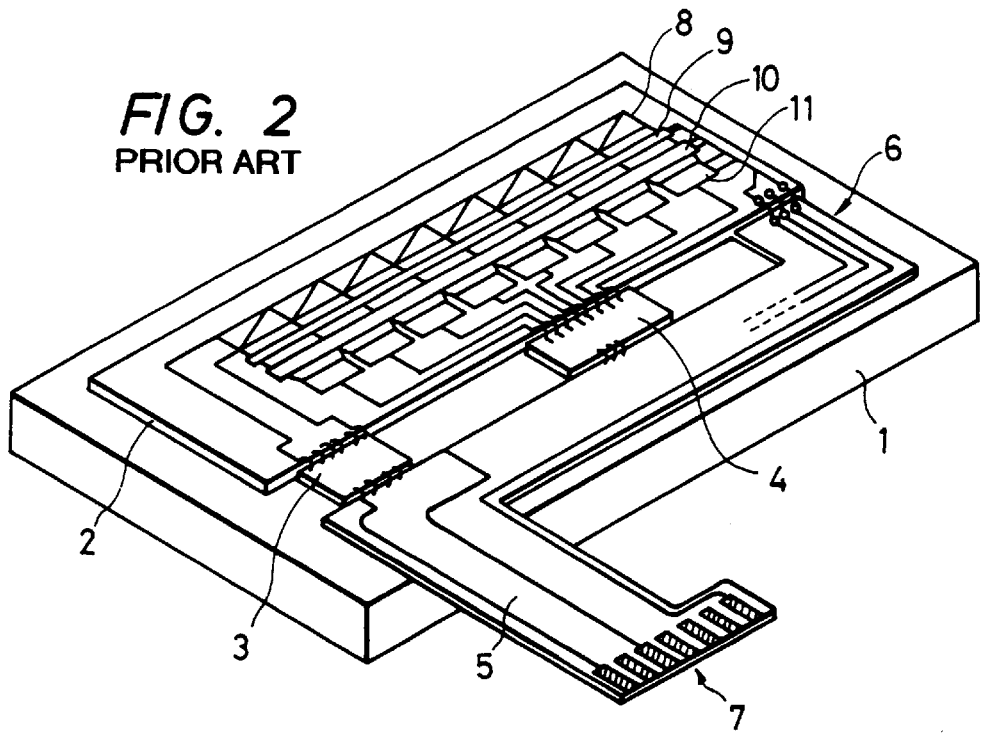
FIG. 2 is a perspective view showing an arrangement. of a conventional sensor unit.
Figure 3:
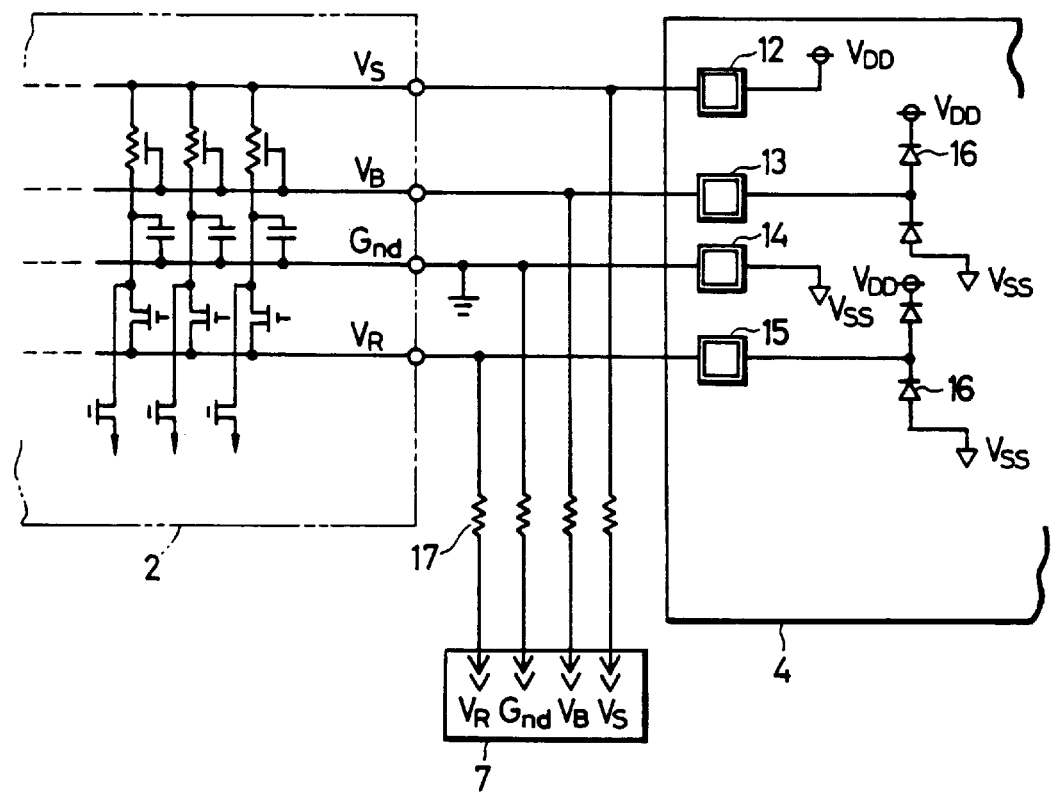
FIG. 3 is an equivalent circuit diagram of an electrostatic prevention section according to the present invention.

FIG. 3 shows a preferred embodiment of an electrostatic prevention circuit in an image sensor according to the present invention.

This circuit includes a sensor substrate 2, a gate driving IC 4, an external connector 7, and a connecting bonding pad 12 commonly connected with a sensor bias power supply $V_S$ to a power supply $V_{DD}$ of the gate driving IC. A bonding pad 14 is connected to ground terminals ($V_{SS}$) of the gate driving IC and the storage capacitors. Terminals 13 and 15 are respectively connected to clamp diodes 16 in the gate driving IC. Each clamp diode 16 is connected to power supply voltages $V_{DD}$ and $V_{SS}$. The terminals 13 and 15 are respectively connected to terminals $V_B$ and $V_R$ of the sensor substrate. An extracting flexible cable comprises wiring resistors 17.

Figure 4:
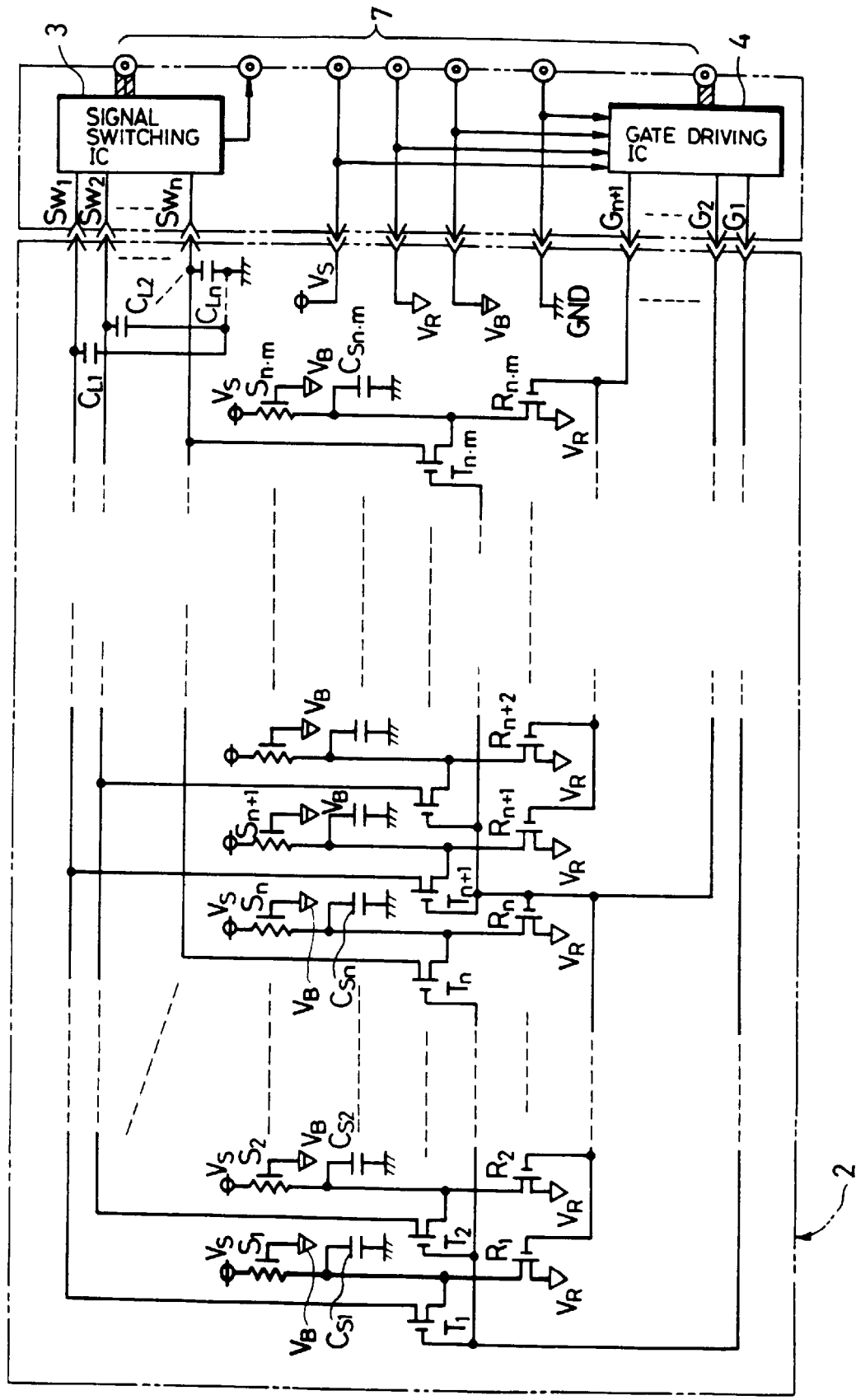
FIG. 4 is an equivalent circuit diagram of a line sensor employing the electrostatic prevention technique according to the present invention.

FIG. 4 shows an equivalent circuit diagram of the image sensor according to the present invention. All external extracting lines of a connector 7 are extracted through or electrical connections to ICs.

Figure 5:
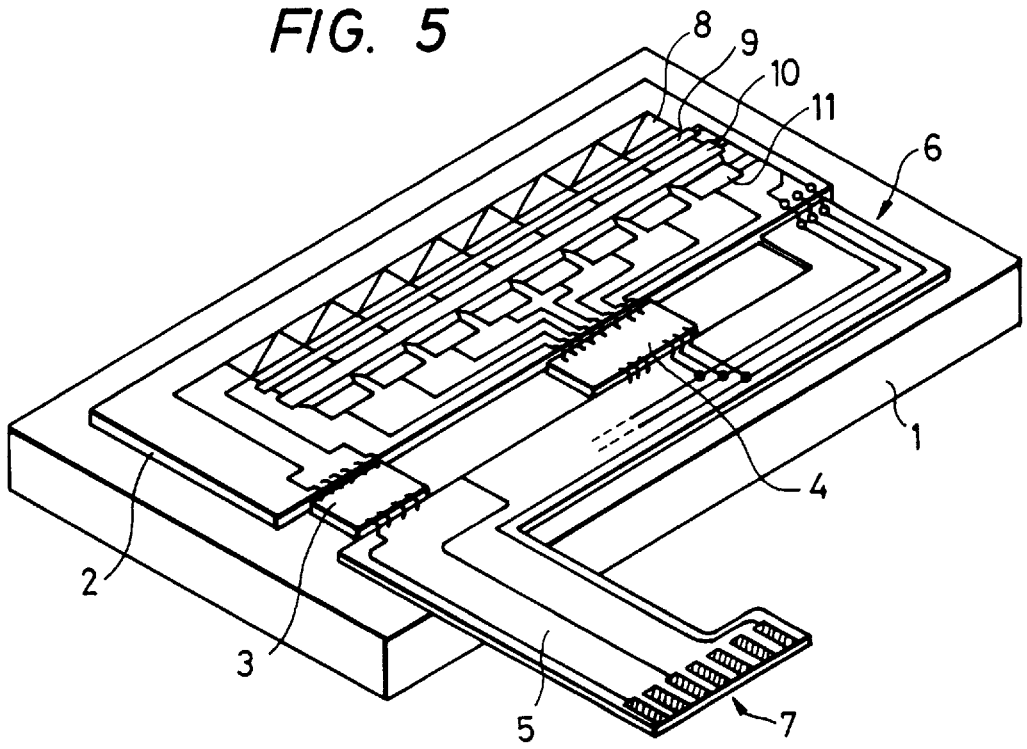
FIG. 5 is a perspective view showing an arrangement of a sensor unit employing the electrostatic prevention technique according to the present invention.

FIG. 5 is a perspective view showing a unit arrangement of the image sensor according to the present invention. The bias lines for bias voltages $V_R$, $V_B$, and $V_S$ run through a wiring pattern of an extracting flexible substrate and are connected to the bonding pad of the gate driving IC. Then, the bias lines are connected to the extracting connector 7.

Assume that static electricity is applied to the extracting connector portion 7 of the sensor unit according to the present invention in handling during transportation and inspection, or in mounting. In this case, the potential is clamped in the driving IC, and TFTs and sensors in the sensor substrate are not damaged. In addition, even if a high voltage is erroneously applied to the bias lines during a test, a clamp operation is performed or damage occurs only to the driving IC and the expensive sensor substrate are not damaged.

The bias lines are connected to the gate driving IC according to the present invention. However, the bias lines may be connected to a signal switching IC, thus obtaining the same effects as described above. The resistors 17 of the extracting flexible cable in FIG. 3 must have high resistances but must cause only negligible voltage drops. The resistances are therefore selected by adjustment of the material or the line width of the wiring pattern.

Since other lines $S_{w1}$ to $S_{wn}$, and $G_1$ to $G_{m+1}$ of the sensor substrate are respectively and directly connected to the ICs, electrostatic breakdown hardly occurs in a sensor unit.

As has been described above, the extracting lines from the sensor substrate are connected to the driving IC in the sensor unit and extracted to external circuits. Therefore, the image sensor of the present invention has the following advantages:

(1) The image sensor is free from electrostatic breakdown in handling and the reliability of the image sensor is improved.

(2) Easy methods may be applied to prevent electrostatic breakdown during transportation, inspection, and mounting, thereby realizing low cost.

(3) The cost of the products is not increased and an electrostatic countermeasure can be provided by simply increasing the number of circuits in the IC.

We claim:

1. A semiconductor apparatus comprising:

plural thin film transistors arranged in a column on a substrate;

plural capacitors respectively connected electrically to first main electrodes of said thin film transistors;

a power source line respectively connected electrically to second electrodes of said thin film transistors;

a gate line for driving said thin film transistors; and an integrated circuit having a circuit for supplying to said gate line a signal for driving said thin film transistors, and a clamp circuit provided separately from said circuit for supplying to said gate line the signal for driving said thin film transistors, wherein said power source line is connected electrically via said clamp circuit to a terminal section of said integrated circuit.

2. A semiconductor apparatus according to claim 1, wherein each said capacitor is connected to a light receiving element.

3. A semiconductor apparatus according to claim 1, wherein said integrated circuit has a plurality of said clamp circuits and each said capacitor is connected to a light receiving element, a bias line for supplying a voltage to said light receiving element is provided, and said bias line is connected to one of said plurality of clamp circuits.

4. A semiconductor apparatus according to claim 1, wherein said integrated circuit has a plurality of said clamp circuits, said apparatus further comprising plural power source lines for supplying voltages to said semiconductor apparatus, said plural power source lines being connected to said plurality of clamp circuits.

5. A semiconductor apparatus according to claim 1, wherein a wiring extending from said power source line to said terminal is connected to said clamp circuit.

6. A semiconductor apparatus according to claim 1, wherein said clamp circuit comprises a diode.

7. A semiconductor apparatus according to claim 6, wherein said diode is a clamp diode.

* * * * *

UNITED STATES PATENT AND TRADEMARK OFFICE
CERTIFICATE OF CORRECTION

PATENT NO. : 5,834,822
DATED : November 10, 1998
INVENTOR(S) : KATSUNORI HATANAKA ET AL.

It is certified that error appears in the above-identified patent and that said Letters Patent is hereby corrected as shown below:

COLUMN 1

Line 21, "Japaneses" should read --Japanese--.

COLUMN 2

Line 44, "arrangement." should read --arrangement--.

Signed and Sealed this

Thirty-first Day of August, 1999

Attest:

Q. TODD DICKINSON

Attesting Officer        Acting Commissioner of Patents and Trademarks